(12) United States Patent
Kawahara

(10) Patent No.: US 11,799,464 B2
(45) Date of Patent: Oct. 24, 2023

(54) AMPLIFICATION CIRCUIT WITH ANALOG MULTIPLEXER

(71) Applicant: DENSO CORPORATION, Kariya (JP)

(72) Inventor: Shogo Kawahara, Kariya (JP)

(73) Assignee: DENSO CORPORATION, Kariya (JP)

( * ) Notice: Subject to any disclaimer, the term of this patent is extended or adjusted under 35 U.S.C. 154(b) by 557 days.

(21) Appl. No.: 17/036,366

(22) Filed: Sep. 29, 2020

(65) Prior Publication Data

US 2021/0013876 A1    Jan. 14, 2021

Related U.S. Application Data

(63) Continuation of application No. PCT/JP2019/009700, filed on Mar. 11, 2019.

(30) Foreign Application Priority Data

Apr. 26, 2018   (JP) ................. 2018-085178

(51) Int. Cl.
   *H03F 3/45*      (2006.01)
   *H03K 17/00*     (2006.01)
   *H03G 1/00*      (2006.01)
   *H03K 17/693*    (2006.01)

(52) U.S. Cl.
   CPC ....... *H03K 17/005* (2013.01); *H03F 3/45475* (2013.01); *H03G 1/0088* (2013.01); *H03K 17/693* (2013.01)

(58) Field of Classification Search
   CPC ..................................................... H03F 3/45
   USPC .............................................. 330/260, 51, 84
   See application file for complete search history.

(56) References Cited

U.S. PATENT DOCUMENTS

| | | | |
|---|---|---|---|
| 5,749,344 A | 5/1998 | Yoshiume et al. | |
| 6,707,405 B2 | 3/2004 | Kuttner | |
| 7,504,974 B2 * | 3/2009 | Iriguchi | H03K 17/005 341/139 |
| 8,823,450 B2 | 9/2014 | Werking | |
| 9,831,842 B2 | 11/2017 | Kiritani | |
| 2008/0074167 A1 | 3/2008 | Iriguchi | |

FOREIGN PATENT DOCUMENTS

| | | |
|---|---|---|
| JP | S62-173809 A | 7/1987 |
| JP | H03-079120 A | 4/1991 |
| JP | H03-173809 A | 7/1991 |
| JP | 3262066 B2 | 3/2002 |

\* cited by examiner

*Primary Examiner* — Henry Choe
(74) *Attorney, Agent, or Firm* — POSZ LAW GROUP, PLC

(57) ABSTRACT

First switches are respectively connected between multiple input terminals and an inverting input of an operational amplifier. Second switches and feedback resistors are respectively sequentially series-connected between an output of the operational amplifier and nodes between the multiple input terminals and the first switches. Third switches are respectively connected between nodes between the second switches and the feedback resistors and an output terminal of an amplification circuit with an analog multiplexer.

7 Claims, 6 Drawing Sheets

AMPLIFICATION CIRCUIT WITH ANALOG MULTIPLEXER

CROSS REFERENCE TO RELATED APPLICATIONS

The present application is a continuation application of International Patent Application No. PCT/JP2019/009700 filed on Mar. 11, 2019, which designated the U.S. and claims the benefit of priority of Japanese Patent Application No. 2018-085178 filed on Apr. 26, 2018. The entire disclosures of both applications are incorporated herein by reference.

FIELD

The present disclosure relates to an amplification circuit with an analog multiplexer.

BACKGROUND

In an amplification circuit having multiple inputs, a configuration in which a multiplexer is added to the amplification circuit, that is, an amplification circuit with an analog multiplexer, is often used so that one amplifier can amplify multiple inputs. For example, in one conventional amplification circuit with an analog multiplexer, inputs are connected to input switches via input resistors, respectively, and signals selected by the input switches are input to an inverting input terminal of an operational amplifier, respectively. A feedback resistor and a feedback switch are also connected in series between an output terminal and the inverting input terminal of the operational amplifier. Thus, multiple inputs can be selected, inverted and amplified.

According to the configuration described above, the switches are configured by MOS transistors. As a result, an error corresponding to a product of a feedback current and a switch on-resistance arises due to the on-resistance of the switch. By increasing a gate drive voltage of the MOS transistor, the on-resistance of each switch can be reduced, but the error cannot be eliminated. This error degrades linearity, offset, and amplification factor of the amplification circuit.

In another conventional amplification circuit, gain switching switches are not arranged in a feedback current path between an input terminal and an output terminal to eliminate influence of an on-resistance of the switch. However, multiple inputs cannot be amplified because there is no multiplexer at the input. Further, even in case a multiplexer is simply provided at the input, the same error as in the one conventional amplification circuit will arise due to an on-resistance of a switch of this multiplexer.

According to the present disclosure, an amplification circuit with an analog multiplexer having multiple input terminals and one output terminal comprises an operational amplifier, a first switch group, a second switch group and a third switch group. The first switch group is connected between the multiple input terminals and the operational amplifier. The second switch group and the feedback resistor group are connected in series in a feedback path of the operational amplifier. The third switch group is connected to the feedback path and the output terminal.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENT

Figure 1:
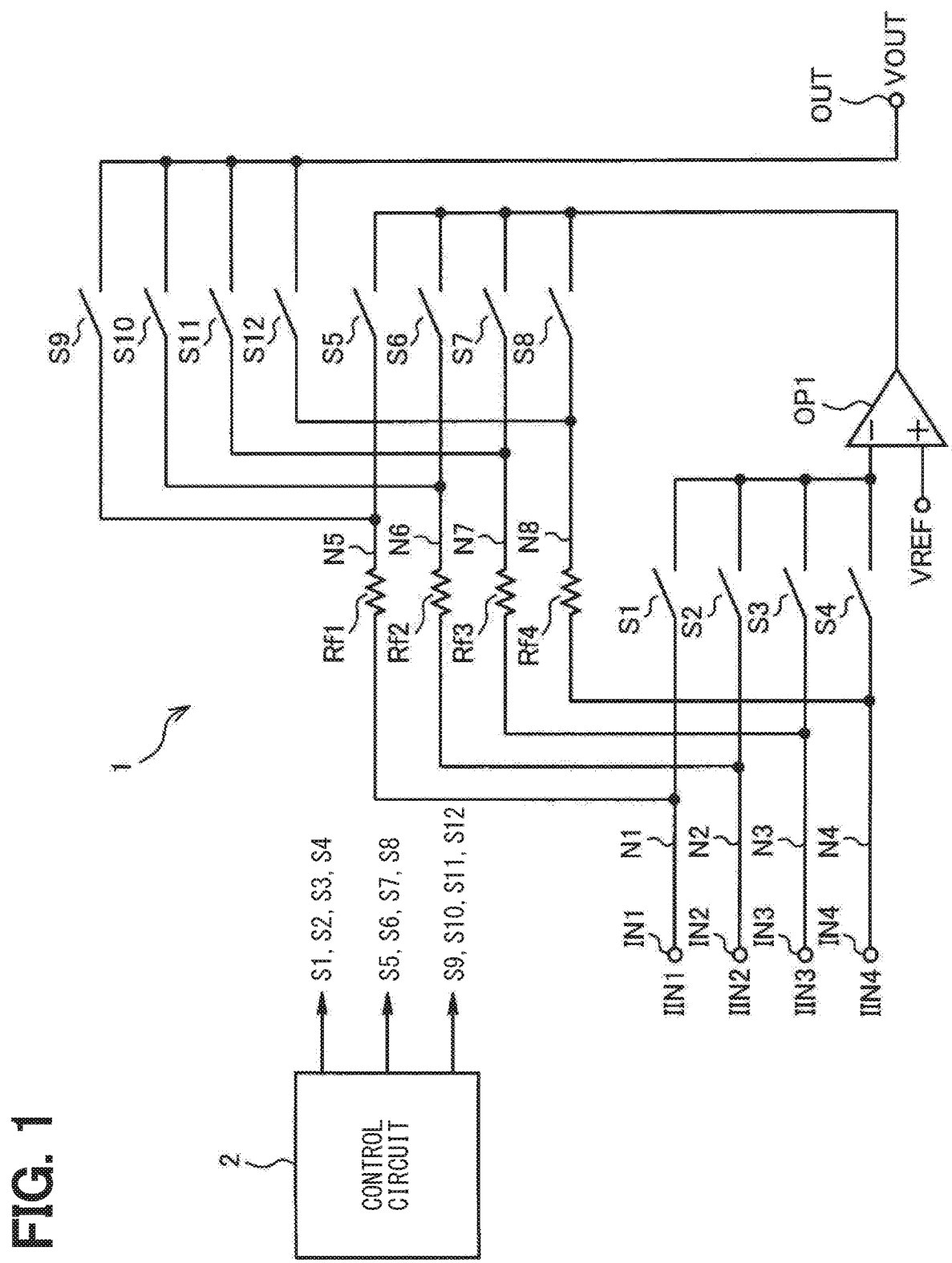
FIG. 1 is an electrical configuration diagram of a first embodiment.

Hereinafter, various embodiments of an amplification circuit with an analog multiplexer will be described with reference to the drawings. In each embodiment, the same or similar configuration is denoted by the same or similar reference numeral to simplify the description.

First Embodiment

The first embodiment will now be described below with reference to FIG. 1 and FIG. 2. FIG. 1 shows an electrical configuration diagram of an amplification circuit with an analog multiplexer (hereinafter simply referred to as amplification circuit 1). The amplification circuit 1 is a current-voltage (I-V) conversion circuit, which includes an operational amplifier OP1, a first switch group including first switches S1 to S4, a second switch group including second switches S5 to S8, a feedback resistor group including feedback resistors Rf1 to Rf4, and a third switch group including third switches S9 to S12. Each of the switches S1 to S12 forming the first to third switch groups is, for example, a MOS transistor, and is configured to be controlled to turn on and off independently from a control circuit 2 provided as a control unit. The first to third switch groups are configured by using one multiplexer. These first to third switch groups have the switches S1 to S4, S5 to S8 and S9 to S12, respectively, corresponding to the number of input terminals of multiple input terminals IN1 to IN4 (for example, four).

First switches S1 to S4 of the first switch group are respectively connected between the multiple input terminals IN1 to IN4 and an inverting input terminal of the operational amplifier OP1. Currents IIN1 to IIN4 are input to the multiple input terminals IN1 to IN4, respectively. In the present embodiment, the input currents IIN1 to IIN4 correspond to multiple inputs. A predetermined reference voltage VREF is input to a non-inverting input terminal of the operational amplifier OP1.

The second switches S5 to S8 of the second switch group and feedback resistors Rf1 to Rf4 of the feedback resistor group are provided between an output terminal of the operational amplifier OP1 and nodes N1 to N4, which are connection points between the multiple input terminals IN1 to IN4 and the first switches S1 to S4, respectively. The second switches S5, S6, S7, S8 and the feedback resistors Rf1, Rf2, Rf3, Rf4 are serially connected in sequence, respectively. That is, the second switch S5 and the feedback resistor Rf1 are serially connected in series between the output terminal of the operational amplifier OP1 and the node N1, and the second switch S6 is connected in series with the feedback resistor Rf2 between the output terminal of the operational amplifier OP1 and the node N2. The second switch S7 and the feedback resistor Rf3 are serially connected in series between the output terminal of the operational amplifier OP1 and the node N3, and the second switch S8 and the feedback resistor Rf4 are connected in series between the output terminal of the operational amplifier OP1 and the node N4.

Resistance values of the feedback resistors Rf1 to Rf4 may be set to different values or the same value. The feedback resistors Rf1 to Rf4 are formed by using, for example, polysilicon (p-Si), tantalum nitride (TaN), or chrome silicon (SiCr). For example, in case the feedback resistors Rf1 to Rf4 are made of tantalum nitride or chrome silicon whose resistance value tolerance can be made relatively easily, degradation of accuracy can be reduced.

The third switches S9 to S12 of the third switch group are connected between nodes N5 to N8, which are connection points between the second switches S5 to S8 and the feedback resistors Rf1 to Rf4, respectively, and an output terminal OUT of the amplification circuit 1. That is, the third switch S9 is connected between the node N5 and the output terminal OUT, and the third switch S10 is connected between the node N6 and the output terminal OUT. The third switch S11 is connected between the node N7 and the output terminal OUT, and the third switch S12 is connected between the node N8 and the output terminal OUT.

The control circuit 2 is formed of, for example, a microcomputer (not shown) including a CPU and a memory, which is a non-transitive tangible recording medium. The control circuit 2, particularly the CPU, is configured to execute, based on the program stored in the memory, processing of controlling the first to third switches S1 to S4, S5 to S8 and S9 to S12 to turn on and off so that the current IIN selected from the multiple input currents IIN1 to IIN4 of the multiple input terminals IN1 to IN4 by the turned-on switch is converted into a corresponding voltage VOUT and the conversion-resultant voltage VOUT is output from the output terminal OUT.

The operation and advantage of the above-described configuration will be described below.

The control circuit 2 selectively selects and turns on the switches (e.g., S1, S5, S9) corresponding to a same current supply path of the input current (e.g., IIN1) input to any one of the input terminals IN1 to IN4 (e.g., IN1). The other switches (for example, S2 to S4, S6 to S8, S10 to S12) are turned off.

Figure 2:
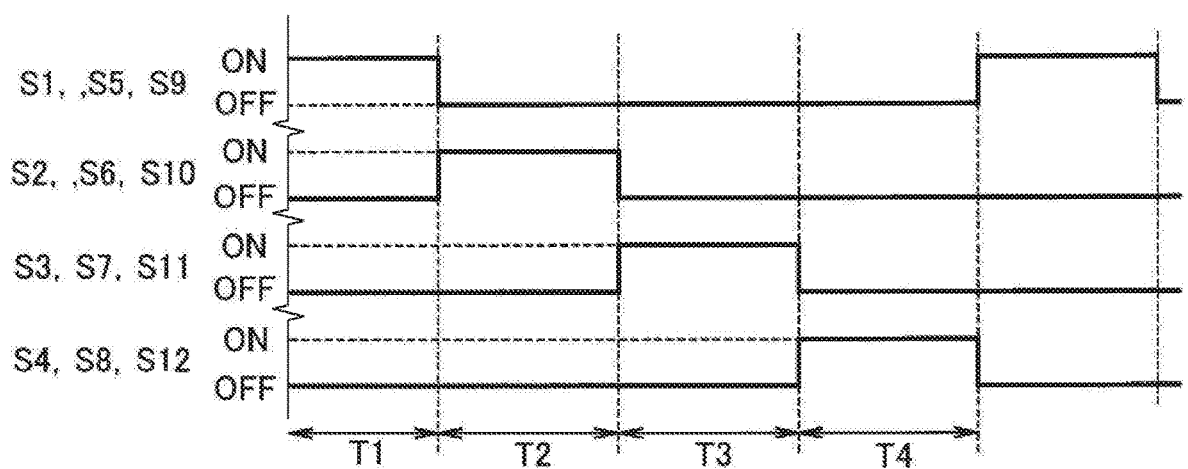
FIG. 2 is a timing chart of the first embodiment.

FIG. 2 shows a timing chart showing on/off switching state of each switch. As shown in a period T1 of FIG. 2, when the control circuit 2 controls the first, second and third switches S1, S5, S9 corresponding to the current supply path of the input current IIN1 of the first input terminal IN1 to turn on synchronously from the OFF state, the control circuit 2 controls all other first, second, and third switches S2 to S4, S6 to S8, and S10 to S12 to turn off. Then, as shown in a period T2 in FIG. 2, the control circuit 2 controls the first, second, and third switches S1, S5, and S9 to turn off from the ON state, and controls the first, second, and third switches S2, S6, and S10 corresponding to the current supply path of the input current IIN2 of the second input terminal IN2 to turn on from the OFF state in synchronization with each other.

As shown in the period T2 of FIG. 2, the control circuit 2 controls the first, second, and third switches S2, S6, S10 to turn on, and the control circuit 2 controls all other first, second, third switches S1, S3, S4, S5, S7, S8, S9, S11, and S12 to turn off. Thereafter, the control circuit 2 operates in the similar manner as described above. As shown in a period T3 in FIG. 2, the control circuit 2 controls the first, second, and third switches S2, S6, and S10 to turn off from the ON state, and then controls the first, second, and third switches S3, S7, and S11 corresponding to the current supply path of the input current IIN3 of the third input terminal IN3 to turn on from the OFF state in synchronization with each other.

As shown in the period T3 of FIG. 2, the control circuit 2 controls the first, second, and third switches S3, S7, S11 to turn on, the control circuit 2 controls the other first, second, and third switches S1, S2, S4, S5, S6 S8, S9, S10 and S12 to turn off respectively. Thereafter, as shown in a period T4 of FIG. 2, the control circuit 2 controls the first, second, and third switches S3, S7, and S11 to turn off from the ON state, and then controls the first, second, and third switches S4, S8, and S12 corresponding to the current supply path of the input current IIN4 of the fourth input terminal IN4 to turn on from the OFF state in synchronization with each other.

As shown in the period T4 of FIG. 2, the control circuit 2 controls the first, second, and third switches S4, S8, S12 to turn on synchronously, and the control circuit 2 controls the other first, second, and third switches S1 to S3, S5 to S7, and S9 to S11 to turn off, respectively. According to the circuit configuration of the amplification circuit 1, the output voltage VOUT is defined by the following equation (1).

$$VOUT = IIN^* \times Rf^* + VREF \qquad (1)$$

Here, symbol * is the number of the current supply path IIN and any one of 1 to 4, and VREF is a reference voltage input to the non-inverting input terminal of the operational amplifier OP1. Since the control circuit 2 selectively turns on the first, second, and third switches S1 to S12 to amplify any one of the current input IIN as described above, the input current of any one of the multiple input terminals IN1 to IN4 is converted into a corresponding current voltage. Here, in case the feedback resistors Rf1 to Rf4 are set to have different resistance values, the current-voltage conversion amplification factor for the currents IIN1 to IIN4 input to the input terminals IN1 to IN4 are made different. Here, in case the feedback resistors Rf1 to Rf4 are set to the same value, the currents IIN1 to IIN4 input to the input terminals IN1 to IN4 are converted into the current-voltage by a constant current-voltage conversion amplification factor.

Comparison Example

As a comparison example, it is assumed that the positions of the feedback resistors Rf1 to Rf4 and the second switches S5 to S8 shown in FIG. 1 are exchanged with respect to the nodes N5 to N8, respectively. In this modified configuration, the second switches S5 to S8 are provided in the feedback path of the current-voltage conversion gain. As a result, a voltage proportional to an on-resistance Ron of the second switches S5 to S8 is superimposed on the output voltage Vout and hence the accuracy of the output voltage VOUT is degraded.

As another comparison example, it is assumed that the first switches S1 to S4 shown in FIG. 1 are provided between the multiple input terminals IN1 to IN4 and the nodes N1 to N4, respectively. In this modified configuration, the on-resistance of the first switches S1 to S4 directly affect the current-voltage conversion gain. As a result, the accuracy of the output voltage VOUT of the current-voltage conversion is degraded.

Advantage of Present Embodiment

According to the present embodiment, the second switches S5 to S8 and the feedback resistors Rf1 to Rf4 are respectively connected in series sequentially from the output terminal of the operational amplifier OP1 to the nodes N1 to N4, which are between the multiple input terminals IN1 to IN4 and the first switches S1 to S4. Therefore, it becomes possible to directly output the voltage from the nodes N5 to N8, which are between the second switches S5 to S8 and the feedback resistors Rf1 to Rf4, through the third switch group S9 to S12 and the output terminal OUT. It thus becomes possible to eliminate the influence of the error related to the on-resistance Ron of the second switches S5 to S8 arranged in the feedback path from the output terminal to the inverting input terminal of the operational amplifier OP1. As a result, the degradation of the accuracy of the current-voltage conversion output voltage VOUT can be prevented, and the degradation of the amplification accuracy can be reduced.

Furthermore, since the switch group (especially the first switch group of the first switches S1 to S4) is not arranged between the multiple input terminals IN1 to IN4 and the corresponding nodes N1 to N4, the influence of the error related to the on-resistance Ron of the switch can be eliminated as described above. It is possible to convert the input currents IIN1 to IIN4 input to the multiple input terminals IN1 to IN4 with high accuracy.

After turning off the first, second, and third switches S1, S5, S9 corresponding to the first input current IIN1 of the first input terminal IN1 from the ON state, the first, second, and third switches S2, S6, S10, which correspond to the second input current IIN2 of the second input terminal IN2, are turned on from the OFF state. As a result, it is possible to prevent degradation of accuracy caused by a transient signal change at the time of switching.

Second Embodiment

Figure 3:
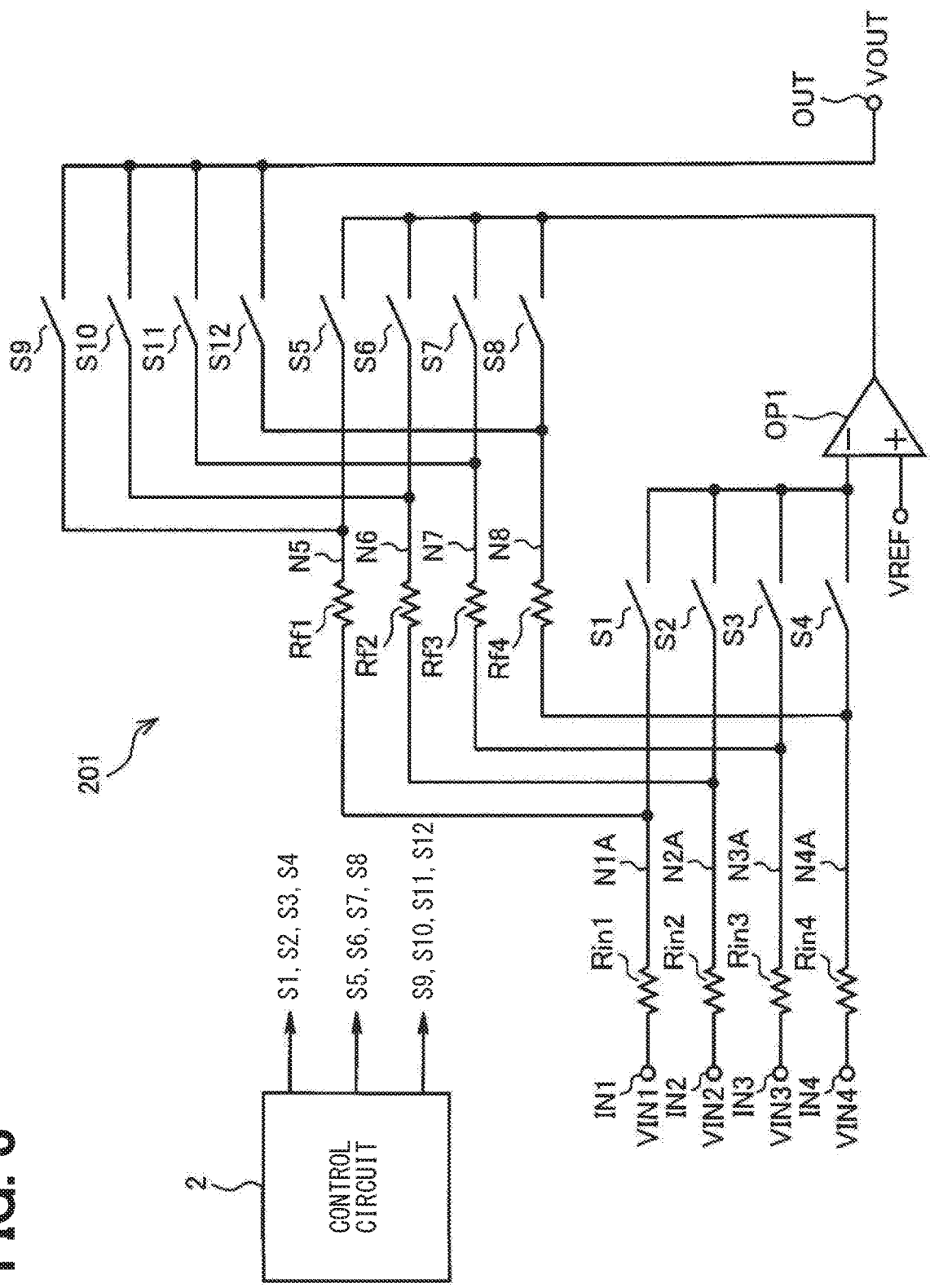
FIG. 3 is an electrical configuration diagram of a second embodiment.

FIG. 3 shows an electrical configuration diagram of an amplification circuit with an analog multiplexer (hereinafter simply referred to as amplification circuit 201) according to the second embodiment. As shown in FIG. 3, input resistors Rin1 to Rin4 of an input resistor group are connected in series between the multiple input terminals IN1 to IN4 and the first switches S1 to S4, respectively. Here, the nodes between the input resistors Rin1 to Rin4 and the first switches S1 to S4 are referred to as nodes N1A to N4A, respectively. Voltages VIN1 to VIN4 are input to the multiple input terminals IN1 to IN4, respectively. The voltages VIN1 to VIN4 are multiple inputs. Other configurations of the present embodiment are the same as the corresponding configurations of the first embodiment. In this configuration, the output voltage VOUT is defined by the following equation (2).

$$VOUT=[(VREF-VIN^*)/Rin^*]\times Rf^*+VREF \qquad (2)$$

Here, * mark is any one of numerals 1 to 4. Even with such a voltage input configuration, the influence of the error related to the on-resistance Ron of the second switches S5 to S8 arranged in the feedback path from the output terminal of the operational amplifier OP1 can be eliminated as in the first embodiment. Further, since the influence of the on-resistance Ron of the first switches S1 to S4 can be eliminated, the degradation of the accuracy of the output voltage VOUT can be reduced.

Third Embodiment

Figure 4:
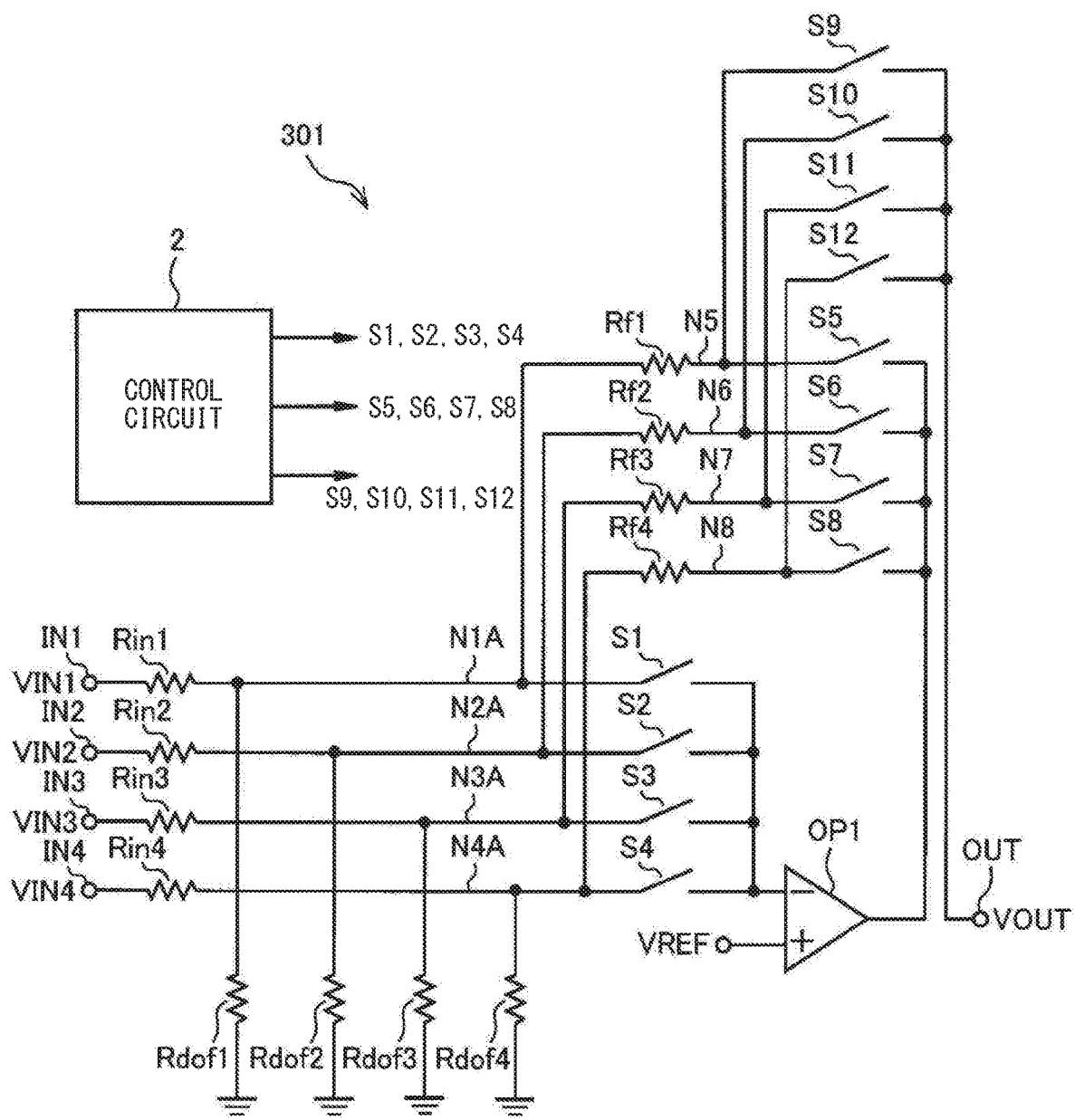
FIG. 4 is an electrical configuration diagram of a third embodiment.

FIG. 4 shows an electrical configuration diagram of an amplification circuit with an analog multiplexer (hereinafter simply referred to as amplification circuit 301) according to the third embodiment. The present embodiment is different from the second embodiment in that, as shown in FIG. 4, offset resistors Rdof1 to Rdof4 of an offset resistor group are arranged between nodes N1A to N4A, which are between the input resistors Rin1 to Rin4 and the first switches S1 to S4, and ground nodes, respectively.

These offset resistors Rdof1 to Rdof4 are provided to increase the withstanding ability against ESD, that is, positive static electricity that may be applied to the input terminals IN1 to IN4. As described above, the first switches S1 to S4 are formed of, for example, MOS transistors. The offset resistors Rdof1 to Rdof4 are provided to protect the drains of the input sides of the MOS transistors, and specifically connected to pull down the nodes N1A to N4A, which are between the input resistors Rin1 to Rin4 and the first switches S1 to S4, to the ground nodes, respectively. The other configurations are similar to those of the first embodiment. In this configuration, the output voltage VOUT is defined by the following equation (3).

$$VOUT=[(VREF-VIN^*)/Rin^*+VREF/Rof^*]\times Rf^*+VREF \qquad (3)$$

Here, * mark is any one of numerals 1 to 4. For example, a maximum static electricity of +15 kV may be applied to the input terminals IN1 to IN4. Even when this +15 kV is applied to the input terminals IN1 to IN4, the input voltage of the input terminals IN1 to IN4 is divided and then applied to the first switches S1 to S4. It is therefore possible to protect the MOS transistors forming the first switches S1 to S4 and also the inverting input terminal of the operational amplifier OP1. Even with such a voltage input configuration, the first switches S1 to S4 are not interposed between the multiple input terminals IN1 to IN4 and the nodes N1A to N4A, respectively. As a result, the influence of the on-resistance Ron can be eliminated and the same advantage as in the second embodiment can be attained. Further, the withstanding ability against the positive static electricity can be improved.

Fourth Embodiment

Figure 5:
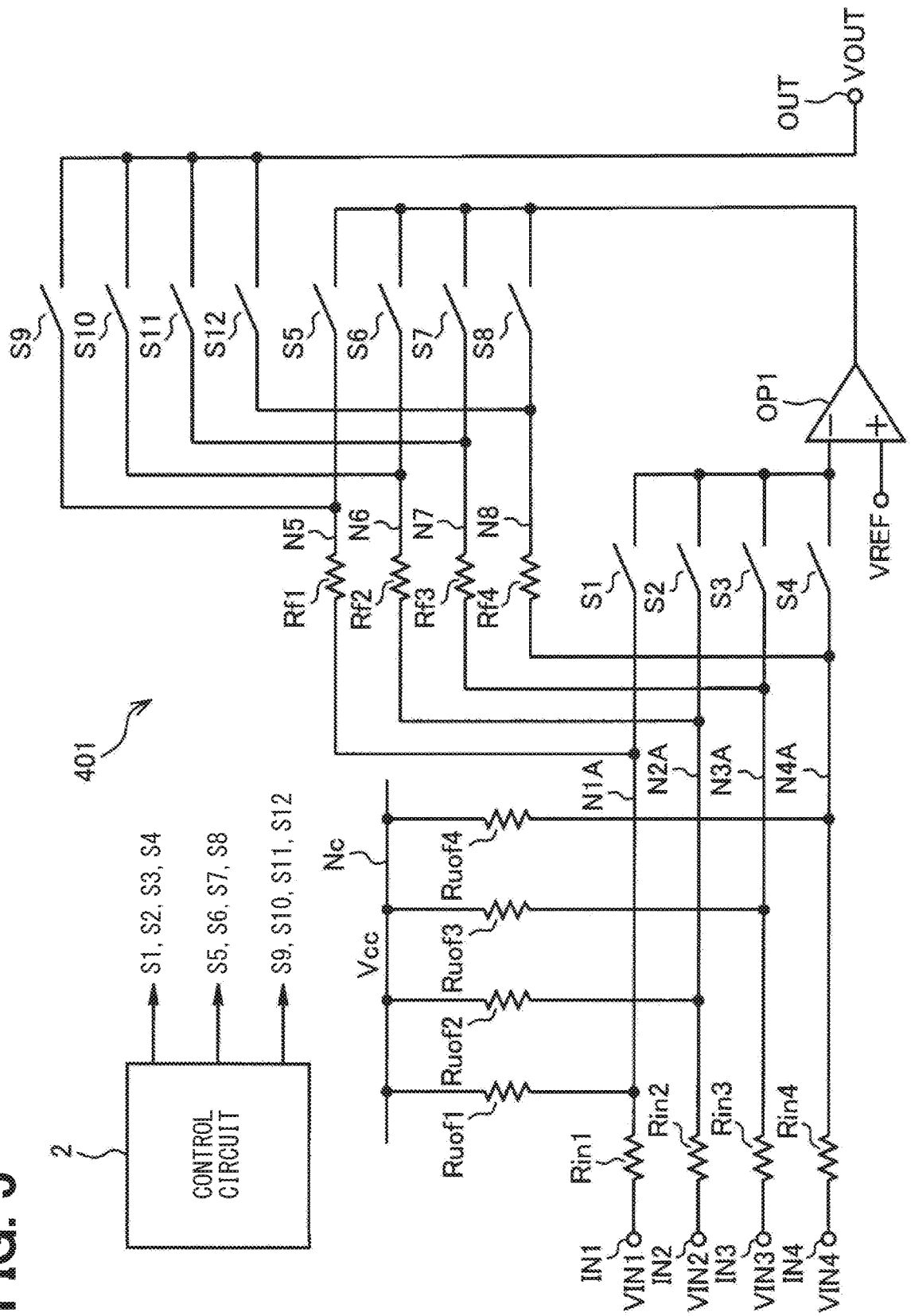
FIG. 5 is an electrical configuration diagram of a fourth embodiment.

FIG. 5 shows an electrical configuration diagram of an amplification circuit with an analog multiplexer (hereinafter simply referred to as amplification circuit 401) according to the fourth embodiment. The present embodiment is different from the second embodiment in that, as shown in FIG. 5, offset resistors Ruof1 to Ruof4 are connected between the nodes N1A to N4A, which are between the input resistors Rin1 to Rin4, and output nodes of a DC power supply voltage Vcc (corresponding to a DC power supply voltage output node) Nc, respectively.

These offset resistors Ruof1 to Ruof4 are provided to increase the withstanding ability against ESD, that is, positive static electricity that may be applied to the input terminals IN1 to IN4. As described above, the first switches S1 to S4 are formed of, for example, MOS transistors. For protecting the drains of the input sides of the MOS transistors, the offset resistors Ruof1 to Ruof4 are connected between the nodes N1A to N4A, which are between the input resistors Rin1 to Rin4 and the switches S1 to S4, and an output node Nc of a DC power supply voltage Vcc, respectively, to pull up the nodes N1A to N4A to the output node Nc. The other configurations of the present embodiment are the same as those of the second embodiment. In this case, the output voltage VOUT is defined by the following equation (4).

$$VOUT=[(VREF-VIN^*)/Rin^*+(Vcc-VREF)/Rof^*]\times Rf^*+VREF \qquad (4)$$

Here, * mark is any one of numerals 1 to 4. For example, a negative static electricity may be applied to the input terminals IN1 to IN4. Even when this negative static electricity is applied to the input terminals IN1 to IN4, the input voltage of the input terminals IN1 to IN4 is divided and then applied to the first switches S1 to S4. It is therefore possible to protect the MOS transistors forming the first switches S1 to S4 and also the inverting input terminal of the operational amplifier OP1. Even with such a configuration, since the first switches S1 to S4 are not interposed between the multiple input terminals IN1 to IN4 and the nodes N1A to N4A, the influence of the on-resistance of the first switches S1 to S4 is eliminated. As a result, the same operational advantage as in the second embodiment can be attained, and the ESD withstanding ability against the negative static electricity can be improved.

Fifth Embodiment

Figure 6:
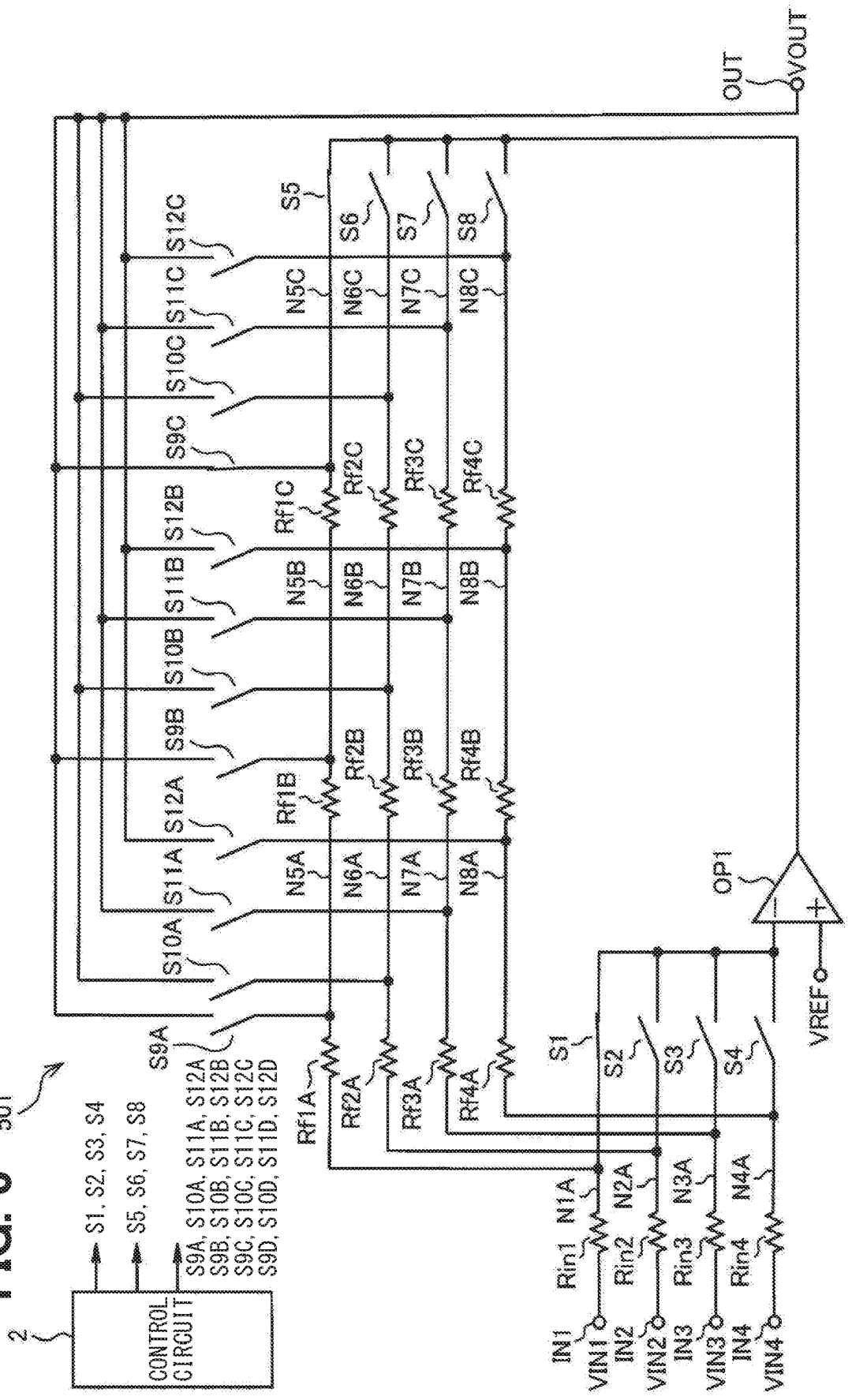
FIG. 6 is an electrical configuration diagram of a fifth embodiment.

FIG. 6 shows an electrical configuration diagram of an amplification circuit with an analog multiplexer (hereinafter simply referred to as amplification circuit 501) according to the fifth embodiment. The present embodiment is different from the second embodiment in that, as shown in FIG. 6, three feedback resistor groups are formed of series-connected multiple feedback resistors Rf1A to Rf4A of the first feedback resistor group, Rf1B to Rf4B of the second feedback resistor group, and Rf1C to Rf4C of the third feedback resistor group, respectively. The present embodiment is also different in that three third switch groups of third switches S9A to S12A, S9B to S12B, S9C to S12C are connected between nodes N5A to N8A, N5B to N8B, N5C to N8C, which are between multiple feedback resistors Rf1A to Rf4A, Rf1B to Rf4B, Rf1C to Rf4C and the second switches S5 to S8, respectively, and the output terminal OUT.

The third switches S9A to S12A, S9B to S12B, S9C to S12C are switch groups that are provided for switching the voltage amplification gain and configured to be controlled to turn on and off by the control circuit 2. The control circuit 2 controls selectively one of switches (for example, switch S9C as shown in FIG. 6) among the third switches S9A to S12A, S9B to S12B, S9C to S12C to turn on, and controls other remaining switches (for example, switches S9A to S12A, S9B to S12B, S10C to S12C in FIG. 6) to turn off. At the same time, the control circuit 2 selectively turns on one of the first switches (for example, switch S1 as shown in FIG. 6) of the first switches S1 to S4, and selectively turn on any of the second switches S5 to S8 (for example, S5 as shown in FIG. 6).

Thus, the amplification circuit 501 outputs the voltage VOUT from a node (for example, N5C in FIG. 6), which is in a middle of the feedback path from the output terminal of the operational amplifier OP1 to the input resistor Rin1 side, through one third switch (for example, S9C in FIG. 6).

Here, when the control circuit 2 turns on the switch S9A, the output voltage is defined by following equation (5-1). When the control circuit 2 turns on the switch S9B, the output voltage is defined by the following equation (5-2). When the control circuit 2 turns on the switch S9C, the output voltage VOUT is defined by the following equation (5-3).

$$VOUT@A=[(VREF-VIN1)/Rin1]\times Rf1A+VREF \qquad (5-1)$$

$$VOUT@B=[(VREF-VIN1)/Rin1]\times(Rf1A+Rf1B)+VREF \qquad (5-2)$$

$$VOUT@C=[(VREF-VIN1)/Rin1]\times(Rf1A+Rf1B+Rf1C)+VREF \qquad (5-3)$$

With the control circuit 2 selectively turning on any one of the third switches S9A, S9B, and S9C (for example, switch S9C) and further turning off the other switches (for example, S9A and S9B), the voltage amplification gain can be changed. Here, the description has been given of the case where the input voltage VIN1 is amplified and output as the output voltage VOUT. The same applies to the other cases where the amplified voltages of the input voltages VIN2 to VIN4 are amplified to be output as the output voltage VOUT.

According to the present embodiment, the control circuit 2 selects one node (for example, node N5C in FIG. 6) from the nodes N5A, N5B, and N5C in the middle of the feedback path from the output terminal to the input resistor Rin1 side and connects the selected node to the output terminal OUT. As a result, the voltage amplification gain can be changed.

Other Embodiment

The present disclosure is not limited to the embodiments described above but may be modified or expanded, for example, as described below. It is possible to combine the above-described embodiments.

The circuit configuration of the above embodiments may be applied to a configuration, in which any one or two of the first to third switch groups including the first switches S1 to S4, second switches S5 to S8, third switches S9 to S12, S9A to S12A, S9B to S12B, S9C to S12C are integrated into one multiplexer. For example, the switches S5 to S8 and S9 to S12 of the second and third switch groups may be configured by an integrated multiplexer. Further, the switches S5 to S8 of the second switch group may be configured by one multiplexer, and the switches S9 to S12 of the third switch group may be configured by one multiplexer.

In the drawings, reference numerals 1, 201, 301, 401, 501 designate the amplifier circuits with analog multiplexers, OP1 designates the operational amplifier, S1 to S4 designate the first switches (first switch group), S5 to S8 designate the second switches (second switch group), S9 to S12, S9A to S12A, S9B to S12B, S9C to S12C designate the third switches (third switch group), Rf1 to Rf4, Rf1A to Rf4A, Rf1B to Rf4B, Rf1C to Rf4C designate the feedback resistors (feedback resistor group), IIN1 to IIN4 designate the input currents (multiple inputs), VIN1 to VIN4 designate the input voltages (multiple inputs), and OUT designate the output terminal.

A part of the above-described embodiment may be eliminated as long as the problem identified in the background is resolvable. Also, all conceivable aspects to an extent not departing from the essence specified by the wording defined by the claims can be also regarded as embodiments.

Although the present disclosure is made based on the above-described embodiments, the present disclosure is not limited to the disclosed embodiments and configurations. The present disclosure covers various modification examples and equivalent arrangements. In addition, various modes/combinations, one or more elements added/subtracted thereto/therefrom, may also be considered as the present disclosure and understood as the technical thought thereof.

What is claimed is:

1. An amplification circuit with an analog multiplexer having multiple input terminals and one output terminal, the amplification circuit comprising:
   an operational amplifier;

a first switch group of first switches connected between the multiple input terminals and an inverting input terminal of the operational amplifier, respectively;

a second switch group of second switches and a feedback resistor group of feedback resistors connected in series with each other between an output of the operational amplifier and nodes, which are between the multiple input terminals and the first switches;

a third switch group of third switches connected between nodes, which are between the second switches and the feedback resistors, and the output terminal, respectively;

an input resistor group of input resistors connected in series between the multiple input terminals and the first switches, respectively; and an offset resistor group of offset resistors connected between nodes, which are between the input resistors and the first switches, and a ground.

2. The amplification circuit with an analog multiplexer according to claim 1, wherein:

each of the feedback resistors is formed of multiple resistors connected in series; and the third switches are connected between nodes, which are between the multiple resistors and the second switches, and the output terminal.

3. The amplification circuit with an analog multiplexer according to claim 1, wherein:

each of the feedback resistors is made of a tantalum nitride or chrome silicon.

4. The amplification circuit with an analog multiplexer according to claim 1, further comprising:

a control circuit configured to control the first, second and third switches of the first, second and third switch groups, to turn on and off synchronously, wherein:

numbers of the first, second and third switches of the first, second and third switch groups are equal to a number of the multiple input terminals; and the control circuit is configured to control the first, second and third switches corresponding to a first input among the multiple input terminals to turn off from an on-state and thereafter control the first, second and third switches corresponding to a second input different from the first input to turn on from an off-state.

5. The amplification circuit with an analog multiplexer according to claim 1, wherein:

the feedback resistors are connected between nodes, which are between the input resistors and the first switches, and the second switches, respectively.

6. An amplification circuit with an analog multiplexer having multiple input terminals and one output terminal, the amplification circuit comprising:

an operational amplifier;

a first switch group of first switches connected between the multiple input terminals and an inverting input terminal of the operational amplifier, respectively;

a second switch group of second switches and a feedback resistor group of feedback resistors connected in series with each other between an output of the operational amplifier and nodes, which are between the multiple input terminals and the first switches;

a third switch group of third switches connected between nodes, which are between the second switches and the feedback resistors, and the output terminal, respectively;

an input resistor group of input resistors connected in series between the multiple input terminals and the first switches, respectively; and an offset resistor group of offset resistors connected between nodes, which are between the input resistors and the first switches, and a DC power supply voltage output node.

7. An amplification circuit with an analog multiplexer having multiple input terminals and one output terminal, the amplification circuit comprising:

an operational amplifier;

a first switch group of first switches connected between the multiple input terminals and an inverting input terminal of the operational amplifier, respectively;

a second switch group of second switches and a feedback resistor group of feedback resistors connected in series with each other between an output of the operational amplifier and nodes, which are between the multiple input terminals and the first switches;

a third switch group of third switches connected between nodes, which are between the second switches and the feedback resistors, and the output terminal, respectively; and a control circuit configured to control the first, second and third switches of the first, second and third switch groups, to turn on and off synchronously, wherein:

numbers of the first, second and third switches of the first, second and third switch groups are equal to a number of the multiple input terminals; and the control circuit is configured to control the first, second and third switches corresponding to a first input among the multiple input terminals to turn off from an on-state and thereafter control the first, second and third switches corresponding to a second input different from the first input to turn on from an off-state.

* * * * *